HIGH INPUT IMPEDANCE WIEN BRIDGE OSCILLATOR

Filed July 14, 1959

INVENTORS
WILLIAM G. REICHERT, JR.
WILLIAM P. GEORGE
BY
Darby & Darby
ATTORNEYS 3,031,627
Patented Apr. 24, 1962

3,031,627

HIGH INPUT IMPEDANCE WIEN BRIDGE OSCILLATOR

William G. Reichert, Jr., Cedar Grove, and William P. George, Fort Lee, N.J., assignors, by mesne assignments, to Fairchild Camera and Instrument Corporation, Syosset, N.Y., a corporation of Delaware Filed July 14, 1959, Ser. No. 827,047
2 Claims. (Cl. 331—110)

Figure 1:
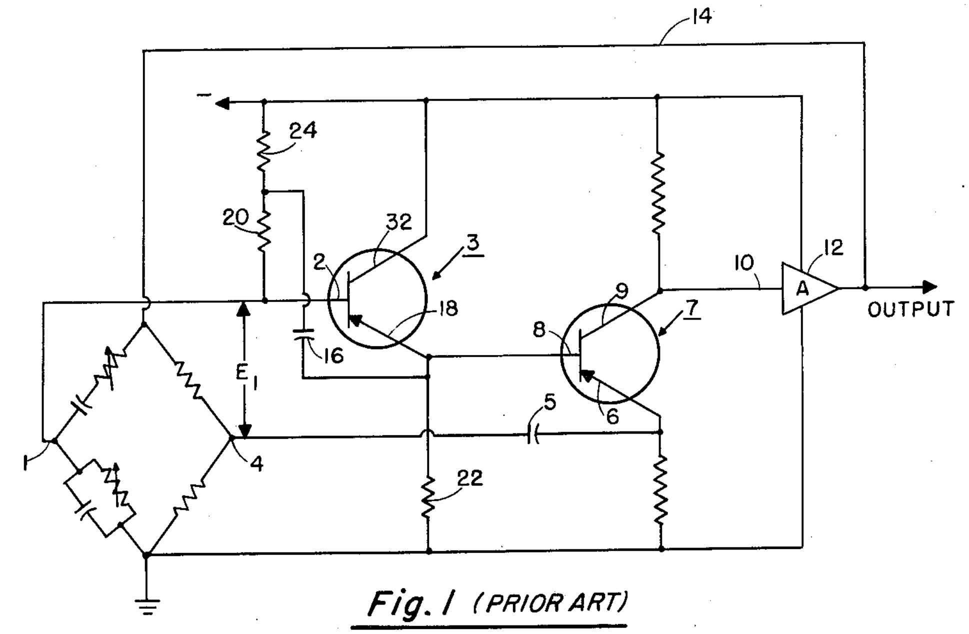
Fig. 1 (PRIOR ART)

This invention relates to high impedance circuits and particularly to an amplifier circuit providing very high input impedance to prevent loading of a source of signal and to permit maximum transfer of energy.

In many applications it is desirable to have amplifier circuits with very high input impedances to avoid attenuation, shunting and distortion of the input signal, and to obtain maximum efficiency and output. Since they inherently have lower input impedances than vacuum tubes, this requirement becomes increasingly important in transistor circuits, and even more important where the input signal can be varied over a wide range of frequencies or amplitudes. Common methods of providing high input impedance have included use of well known feedback techniques, bootstrap circuits, and emitter or cathode follower input stages. Feedback circuits have been highly complex and involve critical problems in preventing unwanted oscillations. Present bootstrap circuits and emitter follower stages also have limitations and cannot provide sufficiently high input impedances for many requirements.

In the usual transistor emitter follower or common collector stage, input signal, which is developed with respect to a common ground or reference point, is supplied from a signal source to a base input electrode. Output signal is then taken from the emitter electrode, while the collector electrode is connected through the direct voltage supply to the common reference. Due to an inherent voltage drop, output at the emitter is slightly smaller, but of the same phase as the input signal. In addition, the configuration presents a characteristic high input impedance between the base and ground which is used advantageously for matching purposes and to isolate the source from the load circuit. However, the resistive voltage divider networks which are generally employed to supply proper bias potentials at the base electrode, act as a shunt path to ground that loads down the stage and reduces the input impedance. This effect has been overcome to some extent by supplying an additional driving or bootstrapping voltage from the same signal source to the opposite end of the divider resistor that connects to the base. In a well known manner, when both ends of an impedance element are driven in unison at approximately equal signal voltage amplitudes, resultant current in the element is reduced to a minimum and its apparent impedance is substantially increased. The bootstrap action thus increases the effective resistance of the base resistor and bias network with respect to ground and in turn raises the input impedance of the stage.

For most purposes, this increase is sufficient. However, in some cases when the input signal is varied over a wide range of frequencies or amplitudes, the back resistance of the transistor collector electrode, although in the order of megohms, becomes effective and causes an additional shunting and reduction of input impedance with respect to ground. This is particularly true in a circuit employing an adjustable or tunable input signal, as for example, a Wien bridge oscillator.

The Wien bridge oscillator is a frequency selective circuit commonly used to provide stable oscillations only at the resonant frequency to which the resistance-capacitance or R-C networks of the bridge are tuned. This type of circuit, which will be more fully described hereinafter, is very sensitive to noise such as that produced by adjustable resistors in the frequency selective arm of the bridge. In order to minimize this noise, it is more desirable to vary the capacitors in these R-C networks. However, at low frequencies, capacitive reactance becomes very large, approaching the magnitude of the back collector resistance, which then tends to load down the input circuit and limit the range of operation. This effect has been difficult to remedy with presently known high input impedance amplifier circuits.

It is therefore the principal object of this invention to provide a novel high input impedance circuit.

It is another object to provide a simple high input impedance circuit which permits increased wide range variation of a source of signal frequency without impairment of circuit operation.

A further object is to provide a higher input impedance circuit which facilitates adjustable selection of the frequency of a signal source while minimizing noise and circuit loading effects.

A still further object is to provide an improved high input impedance transistor circuit which permits use of tuning capacitors to extend the low frequency operating range of a differential signal source.

The instant invention differs from the normal bootstrap configuration in that the added driving signal is fed not only into the input electrode bias network, but also into the emitter and collector electrode circuits. Thus, besides increasing base to ground input impedance, as is usual, the emitter to ground and collector to base impedances are also increased. In addition, as applied in the Wien bridge oscillator, the higher impedance capacitive or R-C arm of the bridge, which is normally the common source of signals, now supplies only the base input signal, while the bootstrapping signals are taken from the resistive or low impedance arm at the opposite side of the bridge, to act as a separate but in phase signal source and reference point. The collector and emitter electrodes, as well as the ends of the associated coupling resistors, are now driven by the separate bootstrap signal source and can be controlled independently of the primary base input signal. Thus, the voltage amplitudes at the appropriate points can be made more nearly equal, to result in much smaller signal currents, considerably larger impedances and decreased loading effects. In addition, the much greater collector to base impedance no longer loads down the input bridge circuit at low frequencies. As a result, the bridge capacitors may now be used to permit a relatively noise free adjustment and extension of the range of operating frequencies.

The detailed description and accompanying drawings which follow will more fully describe the operation and utility of the instant invention. Although the device is considered in a specific circuit configuration, it is to be understood that this embodiment is merely representative, being chosen for explanation and illustration, and is not to be construed as defining the limits of the invention.

Figure 2:
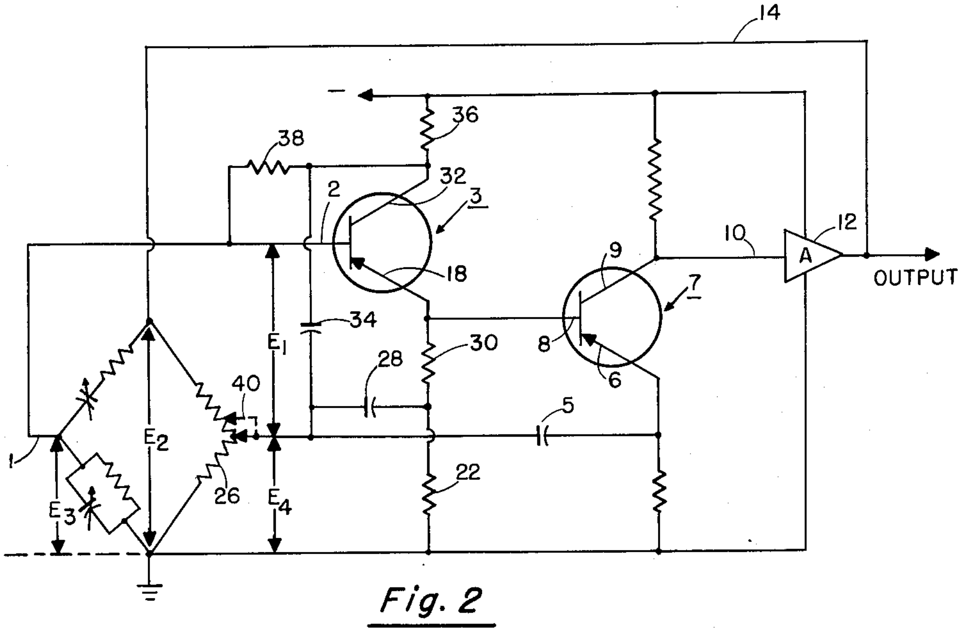

FIG. 1 represents a Wien bridge oscillator circuit combining well known prior art bootstrapping and emitter follower techniques to produce an increased input impedance; and FIG. 2 shows a similar circuit incorporating the novel input configuration of the instant invention.

The Wien bridge oscillator illustrated in FIG. 1 operates at the frequency to which the R-C networks of the bridge are tuned. The division of voltages across the capacitive and resistive arms determines a null point or differential output signal, $E_1$. The selected frequency signal is then passed through an amplifier and returned to the bridge in phase as positive feedback to cause oscillations. The bridge output must actually be set slightly off null to provide a sufficient difference signal into the amplifier and feedback loop to sustain the oscillations. Out of phase signals or voltages at other frequencies are attenuated by the resistive arm which provides negative feedback. A more complete discussion of the theory of operation of the Wien bridge oscillator may be found in "Principles and Practice of Radar," 1950 edition, pp. 70–72, by H. E. Penrose and R. S. H. Boulding, while a description of the detailed circuitry follows.

As shown in FIG. 1, output from the center tap 1 of the adjustable high impedance capacitive side of the bridge is fed into base electrode 2 of an emitter follower first stage 3, while the midpoint 4 of the relatively constant resistive or low impedance reference side of the bridge is connected through coupling capacitor 5 to emitter 6 of a common emitter second stage 7. These connections from the bridge are commonly used to provide a high input impedance at the first stage. The null or difference signal voltage $E_1$, between the two arms of the bridge, passes through the first stage where it is slightly reduced and is then inserted into base 8 of the second stage. The signal is amplified in the latter common emitter stage and appears at the collector 9. The increased signal is next inserted into the input terminal 10 of an additional amplifier stage, represented by block 12, and fed back through path 14, to the upper portion of the bridge, in proper phase relation to cause oscillation.

Bootstrap action at input base 2 is provided by capacitor 16 which couples signal from emitter 18 to resistor 20 connected to the base. The bootstrapping signal taken from the emitter is derived indirectly from the original input to the base and appears in phase and slightly reduced in amplitude at the upper portion of the resistor, compared to that at the lower base portion. The resulting small voltage difference across resistor 20 permits only a small signal current to flow, thus causing the resistor to appear as a high impedance in the path between the input electrode and the direct voltage supply line or signal ground. This effect eliminates the normal loading of the input impedance by the base bias network.

Resistor 22, between emitter 18 and ground, represents the emitter load for the first stage, while resistor 24 completes the bias network between the direct voltage source and the input base. These resistors aid in the proper development of the bootstrap signal and also determine direct current and transistor operating conditions. Use of the prior art circuit described above, increases the normally high input impedance of the emitter follower from a range of hundreds of thousands of ohms, to the order of up to ten megohms. However, when the bridge is tuned to low frequencies, even the latter impedance is insufficient to permit proper operation, since the capacitive reactance approaches the same magnitude and, in conjunction with the collector to base impedance which becomes effective, causes loading and non-linear response. Adjustment of the resistors in the bridge arm also produces unsatisfactory results due to noise.

FIG. 2 shows the improvements of the instant invention which provides input impedances in the order of hundreds of megohms and avoids introduction of noise. This is accomplished by a novel rearrangement of the bridge coupling and signal insertion network. Since the signal differential voltage $E_1$ between the two arms of the bridge is very small compared to the driving voltage $E_2$ across the bridge and output voltage $E_3$ and $E_4$ at either side of the bridge, taken with respect to the ground reference, the latter two voltages may be considered to be substantially equal in amplitude. This effect permits use of the low impedance resistive side or arm of the bridge as a direct and separate source of an equivalent bootstrap signal, rather than the previously used emitter 18 voltage which was derived from the input signal to base 2. Thus, while the normal input signal $E_1$ is again inserted between the base of transistor 3 and the emitter of transistor 7, the bootstrap signal is now developed across bridge resistor 26 and fed into emitter 18 through capacitor 28 and series resistor 30. This signal is also made adjustable as indicated by the arrow at the tap-off point on resistor 26. An additional bootstrap signal is now taken from this resistive side and fed into collector 32 through capacitor 34. The collector signal is developed across resistor 36 which, in conjunction with resistor 38, acts as part of a bias voltage divider between the direct voltage supply and base 2. The effect of the bootstrap signal at collector 32 is to increase the input impedance at that electrode so that upon adjustment at low frequencies, the amplifier circuit no longer loads down the increased impedance of the bridge capacitors. Capacitor 34 also provides bootstrapping of resistor 38 at base 2 in a manner similar to that in the previous configuration and minimizes loading by the bias resistors.

Thus, by using the low constant impedance side of the bridge to obtain bootstrapping, the emitter, collector and base circuits are now driven directly by a source separate from, but synchronized with, that supplying primary input signal to the base. Greater control is therefore made possible and since the emitter is separately driven, the bootstrap effect is made independent of the inherent base to emitter voltage drop. By tapping up on the resistive leg, as shown by dotted line 40, the bootstrap signal voltage may be made still closer in amplitude to the input at the base. This further decreases signal current in the related resistors and permits an even larger input impedance to be established. Ideally, tap 40 feeding the electrodes of stage 3 can be made separate from the connection to emitter 6 of stage 7, but for practical purposes the voltages are so close that by utilizing a single tap, equally good performance is obtained.

An additional effect is to increase the apparent internal impedance between electrodes as well as the resistances of the associated networks. This is accomplished in a like manner to that described previously. For example, since the emitter voltage may now be made closer to that at the base, less signal current is permitted and impedance between the two electrodes is increased. Similarly, since the collector is now driven directly, the usual amplified output of reversed phase that would normally appear at a collector load resistor, is not developed, and an increased impedance occurs between the inphase collector and base. In conjunction with the additional bootstrapped collector electrode, input impedances in the order of hundreds of megohms are now obtainable. The high input impedance is also more effective in comparison with the low impedance source of driving voltage. This magnitude of impedance is much greater than heretofore possible, and thus permits the use of adjustable bridge capacitors to achieve a wide extension of the useful low frequency range, with comparatively noise free operation.

While only one embodiment has been illustrated, it is to be understood that the instant invention is not limited to the exact form or use indicated, and that many variations may be made in the particular design and configuration without departing from the scope of the invention as set forth in the appended claims.

What is claimed is:

1. A high input impedance circuit for a Wien bridge oscillator comprising a bridge signal source having a high impedance frequency selective arm including capacitors and a low impedance resistive arm, said arms being connected together at each end, each said arm having a center tap supplying signals of substantially equal phase and minutely different amplitude, said resistive arm signal providing a source of bootstrap voltage; a source of direct voltage; a signal voltage reference ground connected at one end of said arms; an emitter follower input stage having a base input, emitter output and a common collector electrode; a voltage divider connected between said direct voltage source and said base and collector electrodes to provide operating potential and develop said bootstrap signal, including a first resistor connected between said direct voltage source and said collector and a second resistor connected from said collector to said base; a bootstrap resistor and a load resistor connected respectively in series between said emitter and said reference ground; a signal amplifier stage to amplify said minute signal difference, having input, output and common electrodes, and load means connected to said output electrode; means for coupling said emitter output electrode to said amplifier input electrode; means for feeding back amplified signal from said output electrode to the other end of said bridge source in an in-phase relation to cause oscillation; means for coupling said signal from said high impedance arm center tap into said base electrode; capacitive means connected to said low impedance arm center tap for coupling said bootstrap signal to said collector and second resistor connection, to said emitter through said series bootstrap resistor, and to said amplifier stage common electrode; whereby said bootstrap signal voltage at said collector and emitter electrodes and at said emitter bootstrap and second resistors in cooperation with said base signal greatly reduces signal current between said input stage electrodes and in said bootstrap and second resistors to increase input impedance to ground and prevent loading of said signal source and permit an extension of the range of said frequency selective arm with minimum introduction of noise by adjustment of said capacitors.

2. The device of claim 1 including means for adjusting the amplitude of said bootstrap voltage from said resistive arm.

References Cited in the file of this patent

UNITED STATES PATENTS 2,858,379 Stanley ---------------- Oct. 28, 1958